(12) United States Patent
Herzinger et al.

(10) Patent No.: US 7,142,070 B2
(45) Date of Patent: Nov. 28, 2006

(54) TWO-POINT MODULATOR ARRANGEMENT

(75) Inventors: Stefan Herzinger, München (DE);
Günter Märzinger, Ulrichsberg (AT);
Burkhard Neurauter, Linz (AT);
Robert Weigel, Nuremberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/947,847

(22) Filed: Sep. 23, 2004

(65) Prior Publication Data

US 2005/0104669 A1 May 19, 2005

Related U.S. Application Data

(63) Continuation of application No. PCT/DE03/00602, filed on Feb. 25, 2003.

(30) Foreign Application Priority Data

Mar. 26, 2002 (DE) ................. 102 13 525

(51) Int. Cl.
*H03C 3/06* (2006.01)

(52) U.S. Cl. .............. 332/127; 332/128; 331/16; 331/17; 331/23; 331/25; 327/105; 455/260; 341/143

(58) Field of Classification Search ........ 332/127, 332/128; 331/16, 17, 23, 25; 327/105–107, 327/156–159; 455/260; 341/143

See application file for complete search history.

(56) References Cited

U.S. PATENT DOCUMENTS

| | | | |
|---|---|---|---|
| 4,464,636 A * | 8/1984 | Dobrovolny | 330/300 |
| 4,952,889 A * | 8/1990 | Irwin et al. | 332/128 |
| 5,834,987 A * | 11/1998 | Dent | 332/127 |
| 5,983,077 A * | 11/1999 | Dent | 455/44 |
| 5,990,747 A * | 11/1999 | Chaki et al. | 330/286 |
| 6,972,705 B1 * | 12/2005 | Fei et al. | 341/143 |

FOREIGN PATENT DOCUMENTS

| | | |
|---|---|---|
| DE | 199 29 167 A1 | 12/2000 |
| EP | 1 063 766 A2 | 12/2000 |
| GB | 2 317 512 A | 3/1998 |
| WO | WO 99/07065 A1 | 2/1999 |

OTHER PUBLICATIONS

"Synthesiser Review for Pan-European Digital Cellular Radio", R. A. Meyers and P. H. Waters, IEE Symposium on VLSI Implementation for $2^{nd}$ Generation C. and M. Commun. Systems, 1990, 10 pgs.

"Frequency Modulation in a Phase Lock Loop by Control of the Phase Inside the Loop", Scott Grimmett, Frequency Synthesis Handbook, a Collection from Rfdesign, 1992, 4 pgs.

International Search Report, Int'l Application No. PCT/DE03/00602, Int'l Filing Date Feb. 25, 2003, 3 pgs.

* cited by examiner

*Primary Examiner*—Michael B Shingleton
(74) *Attorney, Agent, or Firm*—Eschweiler & Associates, LLC

(57) ABSTRACT

A two-point modulator arrangement is specified, said arrangement being developed with respect to conventional two-point modulators to the effect that the high-pass coupling-in point of the modulator that comprises a phase locked loop is formed by an expanded loop filter. In accordance with the present principle, the expanded loop filter comprises a coupling-in element, at which the modulation signal is combined with the output signal of a phase comparator. A voltage-controlled oscillator having only one tuning input can thus advantageously be used.

16 Claims, 1 Drawing Sheet

TWO-POINT MODULATOR ARRANGEMENT

REFERENCE TO RELATED APPLICATIONS

This application is a continuation of PCT/DE03/00602, filed Feb. 25, 2003 which was not published in English, that claims the benefit of the priority date of German Patent Application No. DE 102 13 525.8, filed on Mar. 26, 2002, the contents of which both are herein incorporated by reference in their entireties.

FIELD OF INVENTION

The present invention relates to a two-point modulator arrangement.

BACKGROUND OF THE INVENTION

Two-point modulators normally have a phase locked loop (PLL), to which a modulation signal for the phase and/or frequency modulation of a carrier signal is applied at two points. In this case, one point having a high-pass filter behavior and one point having a low-pass filter behavior are usually provided within the phase locked loop, the modulation signal being introduced at each of said points. A superposed signal results at the output of the phase locked loop, with the advantage that the loop exhibits a frequency-independent transmission response.

Two-point modulator arrangements are mentioned, for example, in the document DE 199 29 167 A1. Provided there between the loop filter and the control input of a VCO is a summation point, at which the modulation signal is combined with the output signal of the loop filter. In this case, a high-pass filter transmission response is formed for the modulation frequency. A frequency divider is provided in the feedback path of the phase locked loop, the divider ratio of which is likewise fed in by the modulation signal so as to form a low-pass filter transmission response for the modulation frequency.

Overall, the two-point modulation principle enables modulation, by means of a phase locked loop, with modulation signals whose bandwidth is wider than the bandwidth of the phase locked loop itself.

It has hitherto been a prerequisite for the known two-point modulator that the voltage-controlled oscillator comprises two control inputs, namely one that is driven by the output of the phase comparator via the loop filter and a second that is driven by the modulation signal.

Alternatively, an additional combination element for combining the modulation signal with the output signal of the loop filter could be provided in the phase locked loop but this signifies additional outlay and significantly impairs the noise properties of the modulator.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later. The present invention relates to a two-point modulator arrangement that is suitable for controlled oscillators having only one control input and has good noise properties.

According to one or more aspects of the invention, a two-point modulator arrangement is provided, having a modulation input for supplying modulation data, an output for discharging a modulated signal, and a phase locked loop. The phase locked loop comprises a phase comparator, a controllable oscillator, a loop filter, and a frequency divider, where the phase comparator which comprises a first input, a second input, and an output, and the controllable oscillator comprises a control input and an output. The loop filter comprises an input that is coupled to the output of the phase comparator, an output that is connected to the input of the oscillator, and a further input that is formed at a coupling-in element which is connected to the loop filter and is coupled to the modulation input of the modulator arrangement, where the coupling-in element is connected between a circuit node of the loop filter and a reference potential terminal, and where the coupling-in element is a high-pass coupling-in point of the two-point modulator. The frequency divider is arranged in a feedback path of the phase locked loop, where the frequency divider has an input that is connected to the output of the oscillator, an output that is connected to the first input of the phase comparator, and a control input for setting the divider ratio that is coupled to the modulation input of the modulator arrangement.

In accordance another aspect of the invention, the controlled oscillator may, but need not, have only one tuning input as the control input. Nevertheless, two-point modulation that allows modulation signals having a wide bandwidth to be processed is contemplated in accordance with the present invention, in which case the bandwidth of the modulation signal may be wider than the bandwidth of the phase locked loop.

Expanding the loop filter by a further coupling-in point has the additional advantage that the two-point modulator exhibits good noise properties.

In accordance with another aspect of the invention, the coupling-in element, which forms one of the feeding-in points for the modulation signal, may be connected between a base point of the loop filter of the phase locked loop and a reference potential terminal of the modulator arrangement.

The coupling-in element, which is may be constructed from purely passive components, expands the loop filter and is may be designed in such a manner that the modulation signal having a sufficient bandwidth can be transmitted to the control input of the oscillator.

The expanded loop filter, which makes it possible to combine the modulation signal that has been directly supplied and the modulation signal that has been supplied via the feedback path of the control loop, only slightly influences the dynamic range of the control loop.

The expansion of the loop filter, according to the invention, an in particular the coupling-in element, may comprise a parallel circuit formed from a capacitor and from a series circuit formed from a capacitor and a resistor. In this case, the high-pass coupling-in point may be formed within the series circuit between the resistor and capacitor.

Since the modulation data are preferably in digital form, a digital-to-analog converter may be provided for driving the coupling-in element and is correspondingly connected upstream. A delta-sigma modulator, such as a MASH modulator, may be provided for driving the frequency divider in the feedback path of the control loop, with the modulator driving the frequency divider with the modulation signal at the low-pass coupling-in point. In this case, the frequency divider in the feedback path may be in the form of a so-called multimodulus divider. The frequency divider may be designed in such a manner that it is not only possible to divide the frequency by integers but also, on average over time, by fractions.

Instead of actual modulation data, a step signal may also be applied to the modulation input. This makes it possible for the modulator to be brought to a new frequency in a particularly rapid manner. In this case, the phase locked loop can accordingly lock onto a new channel in a particularly rapid manner, wherein the speed at which the modulator can change the channel is higher than the PLL bandwidth. In this case, the step signal is fed in after a Gaussian filter which may be present.

The following description and annexed drawings set forth in detail certain illustrative aspects and implementations of the invention. These are indicative of but a few of the various ways in which the principles of the invention may be employed.

BRIEF DESCRIPTION OF THE DRAWINGS

The invention is explained in more detail below with reference to exemplary embodiments and with the aid of the figures, in which.

DETAILED DESCRIPTION OF THE INVENTION

Figure 1:
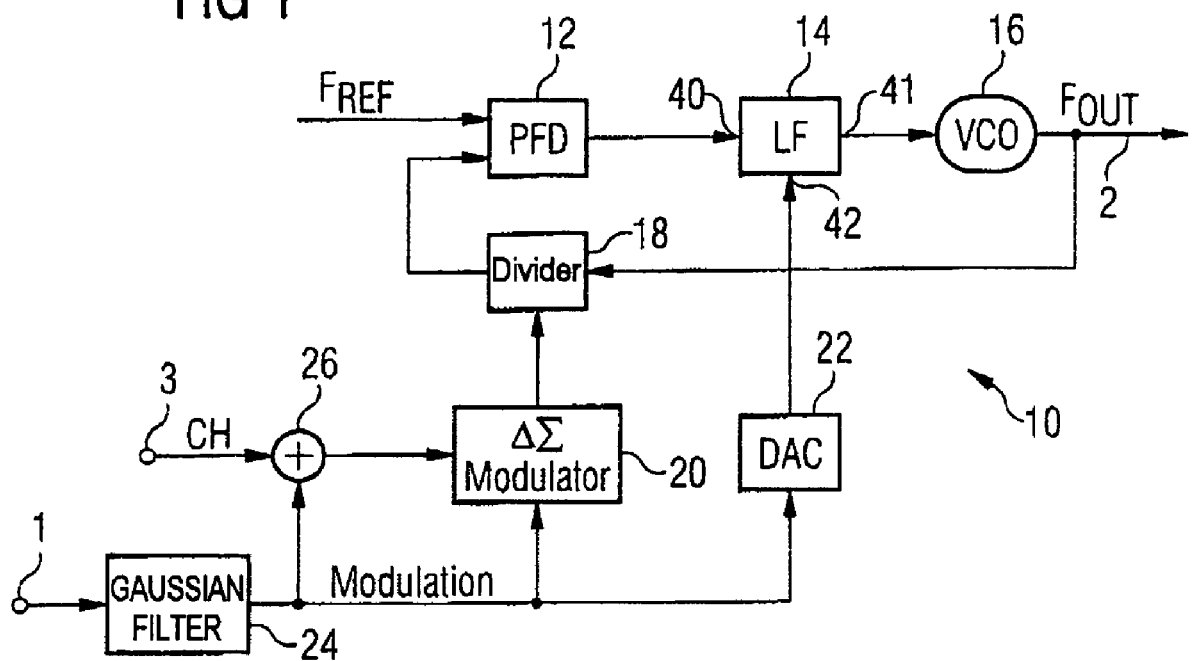
FIG. 1 is a simplified block diagram showing a first exemplary embodiment of the two-point modulator according to the invention.

FIG. 1 shows a two-point modulator 10 having a modulation input 1 for supplying modulation data and an output 2, at which a frequency-modulated and/or phase-modulated signal FOUT can be discharged.

Provision is furthermore made of a phase locked loop 12, 14, 16, 18 comprising a phase detector 12, a loop filter 14, a voltage-controlled oscillator 16 and a frequency divider 18. A first input of the phase detector 12 is connected to the output of the frequency divider 18. A reference frequency source (not depicted here) is connected to a second input, to which a signal at a reference frequency FREF is supplied. The output of the phase detector 12 is connected to the control input of a voltage-controlled oscillator (VCO) 16 via a loop filter 14. The output of the oscillator 16 forms the output 2 of the modulator 10 and is furthermore connected to an input of the frequency divider 18. The frequency divider 18 is in the form of a multimodulus divider and has a control input for supplying modulation data, to be more precise for supplying a signal derived from the modulation data. The loop filter 14 likewise has a further input that is likewise coupled to the modulation input 1 via a digital-to-analog converter 22. The modulation data are first of all Gaussian-filtered by a Gaussian filter 24, which couples the input 1 of the modulator to an input of the digital-to-analog converter 22 and also to the input of a delta-sigma modulator 20. The output of the delta-sigma modulator 20 is connected to the control input of the frequency divider 18. The delta-sigma modulator 20 furthermore has an input for channel preselection, said input being coupled, via a summation element 26, to a further input 3 of the modulator designed to supply a signal for channel preselection. The summation element 26 has a further input that is coupled to the input 1 of the modulator 10 via the Gaussian filter 24.

The frequency divider 18 forms a low-pass coupling-in point for supplying the modulation signal or a signal derived from the modulation signal. By contrast, the loop filter 14, with its additional coupling-in point in accordance with the present invention, advantageously forms a high-pass coupling-in point for a signal derived from the modulation signal. This results overall in a two-point modulator arrangement 10, which can process modulation data having a bandwidth that is wider than the bandwidth of the phase locked loop 12, 14, 16, 18 itself.

Since the loop filter 14 combines the signal that is provided by the phase detector 12 at the output thereof and the modulation signal that is provided by the digital-to-analog converter 22, it is advantageously possible to use a conventional voltage-controlled oscillator 16 that is of simple construction and has only one tuning input. In the embodiment shown in FIG. 1, the loop filter 14 is in the form of a purely passive filter that comprises only concentrated resistors and capacitors and as a result contributes only a small amount of noise to the circuit overall.

In this case, the expanded loop filter 14 is designed in such a manner that the modulation signal that has been provided by the digital-to-analog converter 22 and has a sufficient bandwidth and high-pass filter properties can be transmitted to the tuning input of the voltage-controlled oscillator 16.

The two-point modulator (described) of FIG. 1 is particularly suited to use in mobile radio transmission units on account of the abovementioned advantageous properties such as low noise, low current requirement, etc. In this case, the modulator is particularly suited to operation with phase and frequency modulation.

Figure 2:
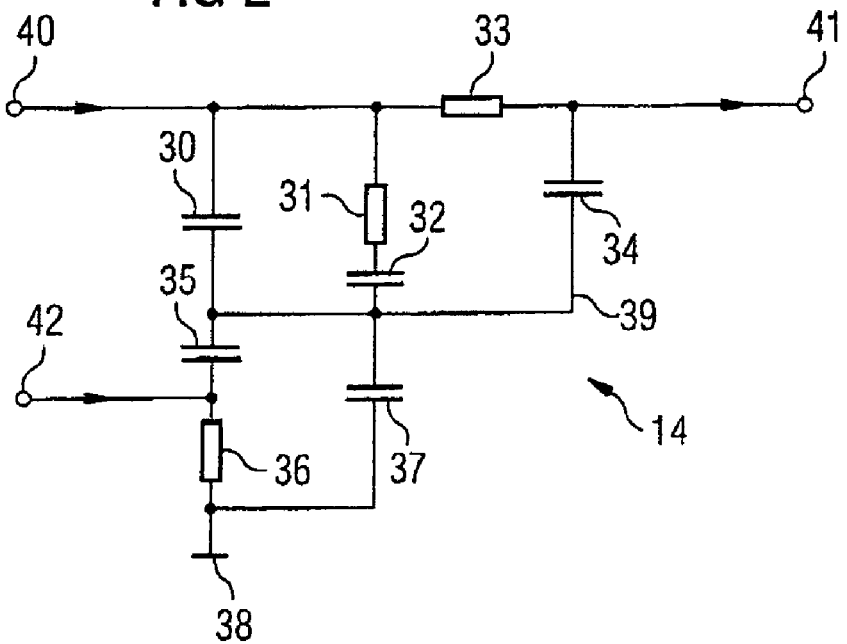
FIG. 2 is a circuit diagram showing an exemplary embodiment of an expanded loop filter for use in a modulator as shown in FIG. 1.

FIG. 2 shows an exemplary embodiment of the loop filter (LF) 14 that has been expanded by a high-pass coupling-in point for supplying a modulation signal in two-point modulation (as shown in FIG. 1). The loop filter 14 shown in FIG. 2 is divided into a five-element loop filter 30, 31, 32, 33, 34 that is constructed from passive components, namely resistors 31, 33 and capacitors 30, 32, 34, and also into a coupling-in element 35, 36, 37 that likewise comprises only capacitors and resistors and is connected as a high-pass coupling-in point between the base point of the conventional loop filter 30 to 34 and a reference potential terminal 38.

A part of the loop filter 30–34 comprises a capacitor 30 that is connected to the base point 39 of the loop filter, a series circuit 31, 32 that is connected in parallel with said capacitor 30 and is formed from a resistor 31 and a capacitance 32, and also a low-pass filter 33, 34 that is connected downstream and is in the form of an RC element 33, 34. In this respect, this part of the loop filter 30 to 34 is connected between the input 40 and output 41 of the loop filter 14. The input 40 of the loop filter is connected to the output of the phase detector 12, if appropriate via a charge pump circuit, while the output 41 of the loop filter 14 is connected to the input of a controlled oscillator 16 of FIG. 1. As an expansion in accordance with the present principle, the coupling element 35 to 37, which comprises a series circuit formed from a capacitor 35 and a resistor 36 and a capacitor 37 connected in parallel with said series circuit, is connected between the base point 39 of the conventional loop filter 30 to 34 and the reference potential terminal 38. The further input 42 of the loop filter 14 is formed between the capacitor 35 and resistor 36 at the common connecting node thereof, said input 42 forming the high-pass coupling-in point of the two-point modulator shown in FIG. 1 in accordance with the inventive principle.

In accordance with the invention, the loop filter 14 is developed with a coupling element 35 to 37 using only three concentrated components which are all passive electronic components, namely resistor 36 and capacitors 35, 37. Since the circuit arrangement described does not introduce any additional active components, the additional noise components of the modulator arrangement in accordance with the present principle are small. The modulation of the two-point modulator is advantageously introduced at the base point of the conventional loop filter 30 to 34. The loop filter 14 thus advantageously couples the modulation that has been introduced by means of the frequency divider 18 and has a low-pass filter behavior, and the modulation that has been introduced at the high-pass point 42 to one another in such a manner that the bandwidth of the modulation signal may be wider than the bandwidth of the control loop 12, 14, 16, 18 of FIG. 1.

It goes without saying that, instead of the loop filter shown in FIG. 2, it is within the scope of the present invention to also provide different loop filters in a modulator 10 shown in FIG. 1, said loop filters forming, in accordance with the invention, an additional modulation input having high-pass filter properties.

The two-point modulator described is advantageously in the form of an integrated circuit.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A two-point modulator arrangement, comprising:
    a modulation input for supplying modulation data;
    an output for discharging a modulated signal; and
    a phase locked loop comprising:
        a phase comparator which comprises a first input, a second input, and an output;
        a controllable oscillator, which comprises a control input and an output;
        a loop filter, comprising:
            an input that is coupled to the output of the phase comparator;
            an output that is connected to the input of the oscillator; and
            a further input that is formed at a coupling-in element which is connected to the loop filter and is coupled to the modulation input of the modulator arrangement, the coupling-in element being connected to the loop filter solely between a circuit node of the loop filter and a reference potential terminal and being in the form of a high-pass coupling-in point of the two-point modulator, wherein the coupling-in element comprising a parallel circuit including a capacitor and a first series circuit having a second capacitor and a resistor, and the coupling-in element is coupled to the loop filter between the circuit node and the reference potential terminal;
        a capacitance that is connected to the circuit node of the loop filter, a second series circuit connected in parallel with the capacitance to the circuit node, the second series circuit comprising a resistor and a capacitance;
        an RC low-pass filter element connected to the circuit node; and
    a frequency divider arranged in a feedback path of the phase locked loop, said frequency divider having an input that is connected to the output of the oscillator, an output that is connected to the first input of the phase comparator, and a control input for setting the divider ratio that is coupled to the modulation input of the modulator arrangement.

2. The modulator arrangement of claim 1, wherein the coupling-in element that is coupled to the loop filter is of passive construction.

3. The modulator arrangement of claim 2, further comprising a delta-sigma modulator, which couples the modulation input to the frequency divider of the phase locked loop; and a digital-to-analog converter, which couples the modulation input to the coupling-in element at the loop filter of the phase locked loop; wherein the delta-sigma modulator and the digital-to-analog converter are provided for conditioning the modulation data.

4. The modulator arrangement of claim 2, wherein the frequency divider of the phase locked loop is a low-pass coupling-in point of the phase locked loop.

5. The modulator arrangement of claim 2, wherein the frequency divider of the phase locked loop is designed with an input from the modulator arrangement to supply a signal for channel preselection.

6. The modulator arrangement of claim 5, further comprising a delta-sigma modulator, which couples the modulation input to the frequency divider of the phase locked loop; and a digital-to-analog converter, which couples the modulation input to the coupling-in element at the loop filter of the phase locked loop; wherein the delta-sigma modulator and the digital-to-analog converter are provided for conditioning the modulation data;
    wherein the frequency divider of the phase locked loop is a low-pass coupling-in point of the phase locked loop.

7. The modulator arrangement of claim 1, further comprising a delta-sigma modulator, which couples the modulation input to the frequency divider of the phase locked loop; and a digital-to-analog converter, which couples the modulation input to the coupling-in element at the loop filter of the phase locked loop; wherein the delta-sigma modulator and the digital-to-analog converter are provided for conditioning the modulation data;
    wherein the frequency divider of the phase locked loop is a low-pass coupling-in point of the phase locked loop; and
    wherein the frequency divider of the phase locked loop is designed with an input from the modulator arrangement to supply a signal for channel preselection.

8. The modulator arrangement of claim 1, further comprising a delta-sigma modulator, which couples the modulation input to the frequency divider of the phase locked loop.

9. The modulator arrangement of claim 1, wherein the frequency divider of the phase locked loop is a low-pass coupling-in point of the phase locked loop.

10. The modulator arrangement of claim 1, wherein the frequency divider of the phase locked loop is designed with an input from the modulator arrangement to supply a signal for channel preselection.

11. The modulator arrangement of claim 1, further comprising a delta-sigma modulator, which couples the modulation input to the frequency divider of the phase locked loop; and a digital-to-analog converter, which couples the modulation input to the coupling-in element at the loop filter of the phase locked loop; wherein the delta-sigma modulator and the digital-to-analog converter are provided for conditioning the modulation data;
   wherein the frequency divider of the phase locked loop is designed with an input from the modulator arrangement to supply a signal for channel preselection.

12. The modulator arrangement of claim 1, further comprising a delta-sigma modulator, which couples the modulation input to the frequency divider of the phase locked loop; and a digital-to-analog converter, which couples the modulation input to the coupling-in element at the loop filter of the phase locked loop; wherein the delta-sigma modulator and the digital-to-analog converter are provided for conditioning the modulation data.

13. The modulator arrangement of claim 1, wherein the frequency divider of the phase locked loop is a low-pass coupling-in point of the phase locked loop.

14. The modulator arrangement of claim 1, further comprising a delta-sigma modulator, which couples the modulation input to the frequency divider of the phase locked loop; and a digital-to-analog converter, which couples the modulation input to the coupling-in element at the loop filter of the phase locked loop; wherein the delta-sigma modulator and the digital-to-analog converter are provided for conditioning the modulation data.

15. The modulator arrangement of claim 14, wherein the frequency divider of the phase locked loop is a low-pass coupling-in point of the phase locked loop; and wherein the frequency divider of the phase locked loop is designed with an input from the modulator arrangement to supply a signal for channel preselection.

16. The modulator arrangement of claim 1, wherein the frequency divider of the phase locked loop is designed with an input from the modulator arrangement to supply a signal for channel preselection.

* * * * *